(12) United States Patent
Pohl

(10) Patent No.: US 9,484,914 B2
(45) Date of Patent: Nov. 1, 2016

(54) ANTI-TRAPPING METHOD AND APPARATUS FOR AN ADJUSTABLE VEHICLE DOOR

(71) Applicant: BROSE FAHRZEUGTEILE GMBH & CO. KOMMANDITGESELLSCHAFT, HALLSTADT, Hallstadt (DE)

(72) Inventor: Florian Pohl, Ebersdorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/533,146

(22) Filed: Nov. 5, 2014

(65) Prior Publication Data

US 2015/0121758 A1 May 7, 2015

(30) Foreign Application Priority Data

Nov. 6, 2013 (DE) .................... 10 2013 018 628

(51) Int. Cl.
*B62D 25/00* (2006.01)
*H03K 17/945* (2006.01)
*B60J 5/00* (2006.01)
*E05F 15/00* (2015.01)
*E05F 15/18* (2006.01)
*E05F 15/20* (2006.01)
(Continued)

(52) U.S. Cl.
CPC .............. *H03K 17/945* (2013.01); *B60J 5/00* (2013.01); *E05F 15/0004* (2013.01); *E05F 15/0021* (2013.01); *E05F 15/18* (2013.01); *E05F 15/2023* (2013.01); *E05F 15/2076* (2013.01); *E05F 15/46* (2015.01); *E05F 15/73* (2015.01)

(58) Field of Classification Search
CPC ............ H03K 17/945; E05F 15/0004; E05F 15/2023; E05F 15/0021; E05F 15/2076; E05F 15/18; B60J 5/00
USPC .......................... 49/25; 296/146.4, 146.8, 56
See application file for complete search history.

(56) References Cited

U.S. PATENT DOCUMENTS 5,083,397 A * 1/1992 Koura ................................ 49/28
5,158,330 A 10/1992 Weyerstall et al.
(Continued)

FOREIGN PATENT DOCUMENTS

CN 102536034 A 7/2012
CN 102787757 A 11/2012
(Continued)

*Primary Examiner* — Jerry Redman
(74) *Attorney, Agent, or Firm* — Laurence A. Greenberg; Werner H. Stemer; Ralph E. Locher

(57) ABSTRACT

An anti-trapping method and a corresponding apparatus for a vehicle door that can be adjusted between an open position and a closed position along an adjustment path by an adjustment motor. First, a proximity sensor is used to monitor an adjustment path region ahead of the vehicle door for the presence of an obstacle during a closing movement of the vehicle door. The closing movement is stopped or reversed when an obstacle is identified in the adjustment path region. Second, when the obstacle is identified during the closing movement of the vehicle door, an additional emergency measure is taken at least when the vehicle door is already closed down to a remaining gap having size does not exceed a prespecified threshold value, and when the presence of the obstacle within this remaining gap is detected.

3 Claims, 2 Drawing Sheets

(51) Int. Cl.
*E05F 15/46* (2015.01)
*E05F 15/73* (2015.01)

(56) References Cited

U.S. PATENT DOCUMENTS

| | | | |
|---|---|---|---|
| 5,216,838 A * | 6/1993 | DeLand et al. | 49/280 |
| 5,531,498 A * | 7/1996 | Kowall | 296/146.4 |
| 7,219,945 B1 * | 5/2007 | Zinn et al. | 296/56 |
| 8,234,817 B2 | 8/2012 | Neundorf et al. | |
| 8,528,948 B2 | 9/2013 | Bettin et al. | |
| 8,534,743 B2 * | 9/2013 | Scheler | 296/146.8 |
| 8,635,809 B2 | 1/2014 | Wuerstlein et al. | |
| 8,875,442 B2 * | 11/2014 | Sohn et al. | 49/139 |
| 9,045,921 B2 | 6/2015 | Eggeling et al. | |
| 2004/0020126 A1 * | 2/2004 | Matsui et al. | 49/138 |
| 2008/0001563 A1 * | 1/2008 | Kimura et al. | 318/280 |
| 2008/0061719 A1 * | 3/2008 | Warren et al. | 318/14 |
| 2008/0296929 A1 * | 12/2008 | Suzuki et al. | 296/146.9 |
| 2009/0217596 A1 * | 9/2009 | Neundorf et al. | 49/506 |
| 2009/0222174 A1 * | 9/2009 | Frommer et al. | 701/49 |
| 2012/0212006 A1 * | 8/2012 | Coldre et al. | 296/146.4 |
| 2012/0285087 A1 * | 11/2012 | Eggeling et al. | 49/29 |
| 2013/0141155 A1 * | 6/2013 | Niwa | 327/517 |
| 2014/0188349 A1 | 7/2014 | Hellmich et al. | |

FOREIGN PATENT DOCUMENTS

| | | |
|---|---|---|
| DE | 3935804 C2 | 12/1990 |
| DE | 102006042562 A1 | 5/2007 |
| DE | 202006013337 U1 | 1/2008 |
| DE | 202008007719 U1 | 4/2009 |
| DE | 202009004327 U1 | 4/2010 |
| DE | 102010009058 A1 * | 8/2011 |
| DE | 102011105460 B3 | 8/2012 |
| EP | 1982030 B1 | 9/2010 |

* cited by examiner

ANTI-TRAPPING METHOD AND APPARATUS FOR AN ADJUSTABLE VEHICLE DOOR

CROSS-REFERENCE TO RELATED APPLICATION

This application claims the priority, under 35 U.S.C. §119, of German patent application DE 10 2013 018 628.5, filed Nov. 6, 2013; the prior application is herewith incorporated by reference in its entirety.

BACKGROUND OF THE INVENTION

Field of the Invention

The invention relates to an anti-trapping apparatus for an automatically adjustable vehicle door, in particular for a tailgate of a motor vehicle, and to a related method.

Automatically adjustable vehicle doors are becoming increasingly widespread in modern motor vehicles. Vehicle doors of this kind are formed, in particular, by sliding (side) doors or tailgates. Vehicle doors of this kind are typically moved reversibly between an open position and a closed position in response to a user signal with the aid of an adjustment motor.

In order to prevent an object, in particular a human body part, from being trapped between the vehicle door and an associated closing edge on a stationary body of the vehicle, during this automatic adjustment of a vehicle door, a vehicle door of this kind usually is equipped with an associated anti-trapping apparatus.

The anti-trapping apparatus is often a capacitively operating anti-trapping means in which the conclusion is drawn that there is an obstacle in the closing path in a contact-free manner on the basis of the signals from a capacitive proximity sensor. When an obstacle of this kind is identified, a command to stop or reverse the vehicle door is output by the anti-trapping means. The command is then normally executed by way of the adjustment motor. Therefore, the adjustment motor is stopped or operated in the opposite direction when the obstacle is identified. Capacitively operating anti-trapping apparatuses are known, for example, from commonly assigned German utility model DE 20 2006 013 337 U1 or from commonly assigned U.S. Pat. No. 8,635,809 B2 and its counterpart German utility model DE 20 2009 004 327 U1.

In this case, it has disadvantageously been found that the movement speed of vehicle doors is often comparatively high, primarily in the largely closed state. In the case of tailgates, this is due, at least, to the door being accelerated by the force of gravity, which acts in the movement direction, during closing. However, even in the case of other motor-operated doors, a comparatively high adjustment speed is often established or maintained in the closing region in order to be able to ensure that the vehicle door reliably latches into an associated (door) lock.

However, owing to the mass inertia of the vehicle door and also owing to further system-related dead times, when an obstacle is identified in this state, it is sometimes difficult or even impossible to stop the vehicle door in good time before the obstacle is trapped. Under unfavorable circumstances, this may result in the vehicle door latching-in in a preliminary latching position of the door lock in spite of the obstacle being trapped, with the result that the door lock stops the vehicle door from being reversed. In the worst case, the vehicle door may engage with a closing aid in spite of the obstacle being trapped, said closing aid possibly being associated with the door lock in order to pull the vehicle door into the locked position against a seal resistance of the door seal. Owing to its function, a closing aid of this kind generates particularly high forces which, in the event of a body part being trapped, can lead to serious injuries and, in the event of an object being trapped, can lead to considerable damage to said object or to the vehicle.

SUMMARY OF THE INVENTION

It is therefore an object of the invention to provide an anti-trapping apparatus for an automatically adjustable vehicle door, which anti-trapping means is improved in terms of safety.

With the above and other objects in view there is provided, in accordance with the invention, an anti-trapping method for a vehicle door, wherein the vehicle door is movable between an open position and a closed position along an adjustment path by an adjustment motor. The novel method comprises:

monitoring an adjustment path region ahead of the vehicle door for a presence of an obstacle during a closing movement of the vehicle door by way of a proximity sensor;

if an obstacle is found to be present in the adjustment path region, stopping or reversing the closing movement of the vehicle door; and if the obstacle is found to be present during the closing movement of the vehicle door, and the vehicle door is already closed as far as a remaining gap having a size not exceeding a prespecified threshold value, and the obstacle is detected within the remaining gap, taking an additional emergency measure.

With the above and other objects in view there is also provided, in accordance with the invention, an anti-trapping apparatus for a vehicle having a vehicle door that is adjustable between an open position and a closed position along an adjustment path by way of an adjustment motor. The novel apparatus comprises:

a proximity sensor for monitoring an adjustment path region between the vehicle and the vehicle door for a presence of an obstacle; and a control and evaluation unit for directly or indirectly driving the adjustment motor, the control and evaluation unit being configured to carry out the method as outlined above.

In the anti-trapping method according to the invention for a vehicle door which can be adjusted between an open position and a closed position along an adjustment path by means of an adjustment motor, firstly an adjustment path region in front of the vehicle door is monitored for the presence of an obstacle during a closing movement of the vehicle door (that is to say an adjustment of the vehicle door in the direction of its closed position) by means of a proximity sensor, wherein the adjustment of the vehicle door is stopped or reversed (by reversal of the movement) when an obstacle is identified.

According to the invention, secondly, when the obstacle is identified during the closing movement, at least one emergency measure is taken in addition to stopping or reversing the adjustment motor at least when the moved vehicle door is already closed as far as a remaining gap of which the size does not exceed a prespecified threshold value, and when the obstacle is detected within this remaining gap. In a reliable embodiment of the invention which can be implemented in a particularly simple manner, the additional emergency measure is taken in each detected trapping situation (that is to say whenever an obstacle is identified during the closing movement and independently of the closing position of the vehicle door). In a preferred embodiment of the invention however, in order to avoid unnecessary control processes, the additional emergency measure is taken only when the size of the remaining gap does not exceed a prespecified threshold value when the obstacle is identified.

The term "remaining gap" generally refers to the space between the vehicle door and the (hard) closing edge of the vehicle body during the closing movement. In this case, the remaining gap can be clear and open or filled (entirely or partially) by the door seal or another flexible material. The remaining gap can likewise have a clear width which varies along the closing edge. The clear width of the remaining gap at a specific point of the closing edge, for example at the location of or in the vicinity of the lock, the closing position of the vehicle door (for example the opening angle of the tailgate), a rotation angle value (or a number of revolutions) of the adjustment motor etc. can selectively be used as a measure of the size of the remaining gap within the scope of the invention, wherein said measure is compared with the respectively correspondingly defined threshold value. The measure for the size of the remaining gap can selectively be measured by means of a sensor or calculated from the actuation of the adjustment motor within the scope of the invention.

The threshold value is preferably selected in such a way that, when the threshold value is reached or exceeded in the event of a trapping situation, it is no longer possible to reliably ensure that the vehicle door will be stopped in good time before the door stops against the closing edge and/or latches in the door lock or the closing aid. A remaining gap, of which the size reaches or exceeds the threshold value, is also referred to as the "critical remaining gap" or as the "remaining gap in the critical range" in this sense in the text which follows. Given a tailgate or sliding door of suitable dimensions, the threshold value is selected in such a way that the clear width of the remaining gap does not fall below a value of approximately 2 to 3 cm when the threshold value is reached—at least in a trapping-related section of the closing edge.

In one embodiment of the anti-trapping method, provision is made for a closing aid which is associated with the vehicle door to be deactivated as the emergency measure. In this case, an apparatus—which is provided in addition to the adjustment motor—which is designed to automatically pull the vehicle door into the locking position of a door lock against the resistance of a door seal which is associated with the closing edge is generally referred to as the closing aid (also: "closure aid"). In this case, the closing aid can act, in particular, on the door lock, in particular on the latch of said door lock (as known, for example, from U.S. Pat. No. 8,528,948 B2 and its counterpart German utility model DE 20 2008 007 719 U1) within the scope of the invention. However, the closing aid can also act on a striker or lock striker which is typically associated with the vehicle body (as known, for example, from U.S. Pat. No. 5,158,330 and its counterpart German patent DE 39 35 804 C2). The risk of injury from said closing aid is advantageously significantly reduced or entirely suppressed by virtue of said closing aid being deactivated.

In addition or as an alternative to deactivating the closing aid, the latching of the vehicle door into a door lock is precluded by the door lock being correspondingly actuated, as the emergency measure. In an expedient and reliable variant of the invention, the latching-in is precluded by the door lock being closed. To this end, a moving latch of the door lock is moved to a closed position in particular. In this case, that part of the door lock which, together with a complementary striker, ensures that the door lock is closed is referred to as the latch. Movement of the latch into its closed position advantageously prevents the door lock from engaging with its associated striker.

In this case, the door lock is expediently blocked in the closed position, so that the door lock or the latch of said door lock collides with the striker, without latching into said striker, when the closing movement of the vehicle door is continued. As a result, the vehicle door is immediately stopped or even springs back. As a result, the risk of injury is advantageously further reduced. In addition, the lock cannot fall into its preliminary latching position, and therefore motor-driven reversing of the vehicle door, which is initiated during the course of the anti-trapping method, cannot be blocked by the door lock.

In the case of a fully automatic door lock (E-lock), which is not only automatically locked and unlocked but in addition can also be automatically opened, the latching-in of the vehicle door is precluded in an alternative embodiment of the invention by the door lock (in particular the latch of said door lock) being kept open—in particular for the entire duration of the trapping situation, specifically for as long as the obstacle is identified or until the vehicle door is reversed.

The anti-trapping apparatus according to the invention for a vehicle door which can be adjusted between an open position and a closed position along an adjustment path by means of an adjustment motor comprises a proximity sensor for monitoring an adjustment path region in front of the vehicle door for the presence of an obstacle.

In this case, the proximity sensor provided is a capacitive proximity sensor. However, in principle, other proximity sensors which operate in a contact-free manner (for example optical sensors, ultrasound sensors etc.) can also be used within the scope of the invention. In addition or as an alternative, the proximity sensor is in the form of a tactile sensor.

In addition, the anti-trapping apparatus comprises a control and evaluation unit which is designed to (in particular automatically) carry out the anti-trapping method according to one of the above-described embodiments. In this case, the control and evaluation unit serves to actuate the adjustment motor (specifically to stop or reverse the adjustment motor in the event of a trapping situation) and to this end is connected to the adjustment motor so as to transmit signals in the intended installation state. In this case, the control and evaluation unit can act directly on the adjustment motor by virtue of the control and evaluation unit being functionally integrated into a motor controller. However, the control and evaluation unit can also act indirectly on the adjustment motor within the scope of the invention by said control and evaluation unit acting on a separate motor controller.

In a first embodiment, the control and evaluation unit is coupled to the closing aid so as to transmit signals, in order to deactivate said closing aid as an emergency measure. As an alternative or in addition, the control and evaluation unit is coupled to the door lock so as to transmit signals, in order to close said door lock as an emergency measure.

Other features which are considered as characteristic for the invention are set forth in the appended claims.

Although the invention is illustrated and described herein as embodied in anti-trapping means for an adjustable vehicle door, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

Parts and variables which correspond to one another are provided with the same reference symbols throughout the figures.

DETAILED DESCRIPTION OF THE INVENTION

Figure 1:
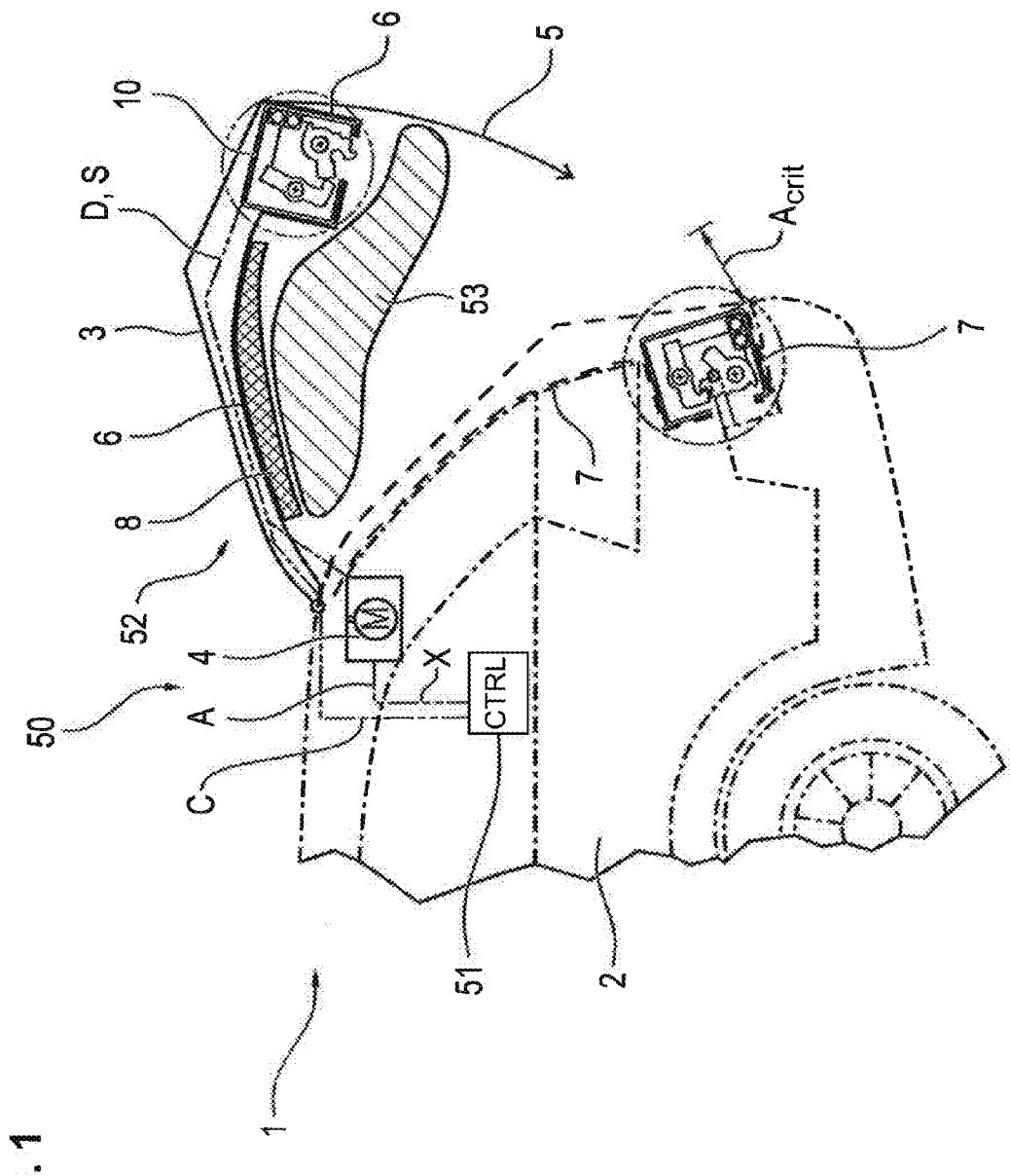
FIG. 1 shows a schematic side view illustration of a motor vehicle having a tailgate which is provided with an anti-trapping apparatus and which can be adjusted by motor and comprises a door lock with a closing aid.

Referring now to the figures of the drawing in detail and first, particularly, to FIG. 1 thereof, there is shown a rear portion of a vehicle 1 which comprises a vehicle door which can be adjusted in relation to a vehicle body 2, in this case a tailgate 3. The tailgate 3 can be moved to an open position (illustrated using solid lines) or a closed position (illustrated using dashed lines) in a reversible manner with the aid of an electric adjustment motor in response to a user signal. In order to better distinguish between the further motors and drives, the adjustment motor is referred to as the hatch drive 4 in the following text. During the adjustment process, the tailgate 3 travels over an adjustment path 5. In the closed position, a peripheral border 6 of the tailgate 3 rests against a closing edge 7 on the vehicle body. A door seal 8—fitted to the tailgate 3 by way of example in this case—is situated between the border 6 and the closing edge 7. In a departure from the schematically simplified illustration, the door seal 8 runs around the entire border 6.

Figure 2:
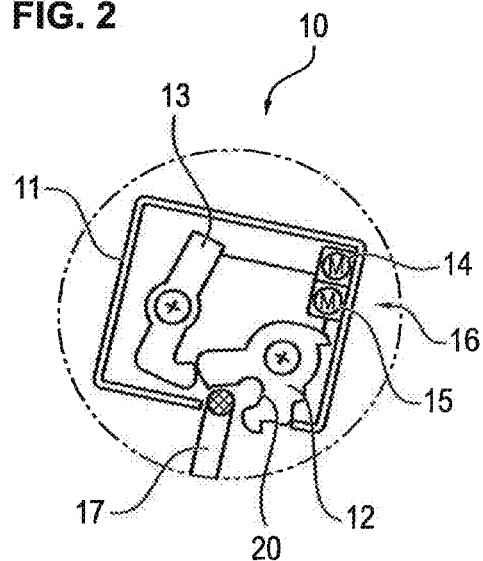
FIGS. 2-5 are detail views of the door lock according to FIG. 1, each in a different closing position.

The tailgate 3 includes a door lock 10, only very roughly schematically indicated, which is in an open position, illustrated in FIG. 2, when operated as intended with the tailgate 3 open. In the case of a tailgate 3 which is virtually closed or nearly closed, the door lock is in a preliminary latching position according to FIG. 3. In the case of a tailgate 3 which is fully closed, the door lock assumes a main latching position or full latching position, as illustrated in FIG. 4.

The door lock 10 comprises a housing 11 (FIG. 2) in which a latch 12 and also a pawl 13 are accommodated and rotatably mounted. The pawl 13 is coupled to a pawl drive 14 in order to be automatically adjusted, while the latch 12, for its part, is coupled to a closure aid drive 15 of a closing aid 16 in order to be automatically adjusted. As an alternative, the pawl drive 14 and/or the closure aid drive 15 can also be arranged outside the housing 11. In this case, said drives are coupled to the pawl 13 or to the latch 12, in particular, with the aid of a Bowden cable or the like. The door lock 10 has an associated striker 17 which is arranged on the vehicle body.

In an alternative embodiment (not illustrated in any detail), the housing 11 and the latch 12 and pawl 13 are arranged on the vehicle body, while the striker 17 is arranged on the tailgate 3.

In the open position according to FIG. 2, the pawl 13 is moved to a raised position, in which it releases the latch 12, with the aid of the pawl drive 14. A recess 20 in the latch 12 faces the striker 17, illustrated in outline here, in order to receive the striker.

Figure 3:
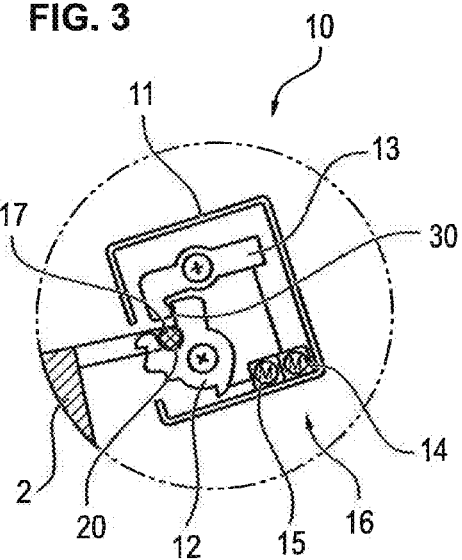
Figure 4:
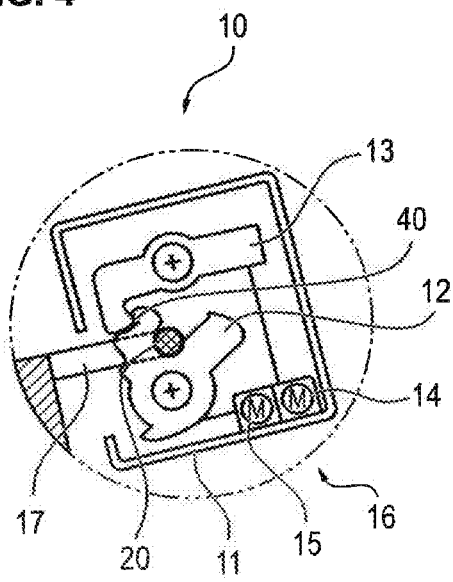

In the case of a tailgate 3 which is nearly closed, the latch 12 will, according to FIG. 3, move to a preliminary latching position in which the latch 12 is held at a preliminary catch 30 of the latch 12 by the pawl 13, in particular due to mechanical interaction with the striker 17. In the preliminary latching position, the striker 17 is locked in the recess 20 in the latch 12, so that the tailgate 3 is latched to the door lock 10.

Since the force of the hatch drive 4 is typically insufficient to overcome the resistance which is produced in the event of compression of the door seal 8 (FIG. 1), the closure aid drive 15 moves the latch 12 to the main latching position, shown in FIG. 4, in which said latch is locked against a main catch 40 by the pawl 13. The striker 17 also engages in a locking manner with the recess 20 in the latch 12 in the main latching position.

The tailgate 3 further has an associated anti-trapping apparatus 50 (FIG. 1) which comprises a control and evaluation unit 51 (CTRL), which is connected to the hatch drive 4 so as to transmit signals, and also a capacitive (proximity) sensor 52.

The control and evaluation unit 51 comprises, as an important constituent part, a microcontroller which, in this case, integrates the functions of trapping prevention and motor actuation by way of example. The control and evaluation unit 51 therefore also serves as a motor controller (tailgate controller).

In an exemplary embodiment, the sensor 52 comprises an electrode arrangement with a transmitter electrode and also a receiver electrode at a distance from said transmitter electrode (neither being explicitly illustrated) which both extend along the door seal 8 and are encapsulated by said door seal. A shielding electrode is optionally likewise situated in the door seal 8. In a departure from the illustration, the door seal 8—including the electrodes—can also be arranged on the vehicle body. The electrodes can also be separate from the door seal 8.

The transmitter electrode is connected to a signal generating circuit (not explicitly illustrated) in order to generate an alternating electrical field. The sensor 52 further comprises a capacitance measuring element (not explicitly illustrated), for example in the form of a transimpedance amplifier, which is connected to the receiver electrode, in order to detect a capacitance signal C which is characteristic of the electrical capacitance of the electrode arrangement. In the present case, the capacitance of the transmitter electrode is determined in relation to the receiver electrode. As an alternative, the sensor 52 can also have a sensor electrode by means of which the capacitance is measured in relation to ground (the grounded vehicle body 2 in this case). Furthermore, the sensor 52 can additionally comprise a tactile sensor which reacts, for example, to deformation of the door seal 8.

The signal generating circuit and also the capacitance measuring element are connected to the control and evaluation unit 51 in order to further evaluate the capacitance signal C. As an alternative, the signal generating circuit and also the capacitance measuring element can also be integrated into the control and evaluation unit 51.

The anti-trapping apparatus 50 initially serves to scan an adjustment path region 53 (indicated by hatching), in each case in front of the tailgate 3, for the presence of an obstacle in a known manner.

For scanning purposes, the capacitive sensor 52 generates an electrical field which extends over the adjustment path region 53 which is to be scanned. The electrical field and therefore the capacitance signal C are changed in a characteristic manner due to the presence of an obstacle, in particular of a human body part, in the adjustment path region 53. If the control and evaluation unit 51 identifies a trapping situation on the basis of a change of this kind in the capacitance signal C when the tailgate 3 is closed, said control and evaluation unit sends a reversing command X to the hatch drive 4, in response to which the drive is stopped and the direction of rotation is changed.

Since a particularly high reversing force of the adjustment motor or of an associated spindle is required in the region of the lock inlet, the force of the hatch drive 4 is sometimes insufficient to stop or to reverse the tailgate 3 quickly enough in the case of a small opening angle of the tailgate 3. Even in the case of an obstacle being detected, there would be the risk of the tailgate 3 reaching the preliminary latching position in the absence of the precautions described below in unfavorable circumstances, as a result of which the closing aid 16 would be activated.

In order to avoid this, the control and evaluation unit 51 is designed to perform at least one emergency measure, in addition to the above-described anti-trapping measures, when an obstacle is detected, while the closing tailgate 3 is within a critical adjustment range in which the tailgate 3 can no longer be reliably stopped before reaching the preliminary latching position.

This critical adjustment range is reached as soon as the size of the remaining gap which is formed between the tailgate 3 and the closing border 7 falls below a prespecified threshold value. By way of example, the clear width of the remaining gap in the lock region, that is to say the distance A in the lock region between the border 6 of the tailgate 3 and the associated closing edge 7, is used as a measure of the size of the remaining gap. The associated threshold value is stored, for example, as a critical distance $A_{crit}$ with a value of, for example, 3 cm.

The control and evaluation unit 51 uses the measurement values from a revolution counter, which is associated with the hatch drive 4, to calculate the distance A between the border 6 and the closing edge 7 and compares this distance with the critical distance $A_{crit}$ continuously or at regular intervals. If the value of the distance A has reached or fallen below the critical distance $A_{crit}$ and the sensor 52 detects an obstacle in the adjustment path region 53, the control and evaluation unit 51 firstly outputs the reversing command X to the hatch drive 4 and secondly initiates the emergency measure.

In a first embodiment, the control and evaluation unit 51 is coupled to the closing aid 16, specifically to the closure aid drive 15 of said closing aid, so as to transmit signals to this end. In the process, the control and evaluation unit 51 outputs a deactivation command D to the closure aid drive 15 as an emergency measure, this having the effect of the closing aid not adjusting the latch 12 to its closed position when the tailgate is supposed to reach the preliminary latching position. In this case, the deactivation command D overrides, in particular, a tripping command, on account of which the closing aid 16 would otherwise be triggered to close.

Figure 5:
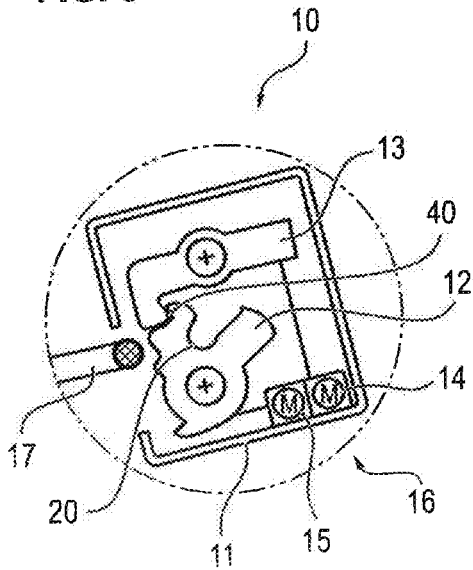

In a second embodiment, the control and evaluation unit 51 is coupled to the door lock 10 so as to transmit signals. In this case, the control and evaluation unit 51 sends a closing command S to the closure aid drive 15 when an obstacle is detected within the critical distance $A_{crit}$, said closure aid drive turning the latch 12 to its closing position on account of said closing command. In addition, the control and evaluation unit 51 turns off the pawl drive 14 in this case, so that the pawl 13 is not raised and the lock is blocked in the closed position. As shown in FIG. 5, the latch 12 collides with the striker 17 or possibly even springs back as a result when the tailgate 3 is closed further.

The two emergency measures described above can be provided individually or in combination with one another. In the latter case, the two emergency measures can also have different associated critical adjustment ranges.

The subject matter of the invention is not limited to the exemplary embodiments described above. Rather, further embodiments of the invention can be derived from the above description by a person skilled in the art. In particular, the individual features of the invention which are described with reference to the various exemplary embodiments and the variants of said individual features can also be combined with one another in a different way.

The following is a summary list of reference numerals and the corresponding structure used in the above description of the invention:
1 Vehicle
2 Vehicle body
3 Tailgate
4 Hatch drive
5 Adjustment path
6 Border
7 Closing edge
8 Door seal
10 Door lock
11 Housing
12 Latch
13 Pawl
14 Pawl drive
15 Closure aid drive
16 Closing aid
17 Striker
20 Recess
30 Preliminary catch
40 Main catch
50 Anti-trapping apparatus
51 Control and evaluation unit
52 (Proximity) sensor
53 Adjustment path region
A Distance
$A_{crit}$ (Critical) distance
C Capacitance signal
X Reversing command
D Deactivation command
S Closing command

The invention claimed is:

1. An anti-trapping method for a vehicle door, wherein the vehicle door is movable between an open position and a closed position along an adjustment path by an adjustment motor, the method comprising:
   during a closing movement of the vehicle door from the open position towards the closed position, monitoring an adjustment path region ahead of the vehicle door for a presence of an obstacle by way of a proximity sensor;
   when an obstacle is found to be present in the adjustment path region, stopping or reversing the closing movement of the vehicle door; and
   when the obstacle is found to be present during the closing movement of the vehicle door, and the vehicle door is already closed as far as a remaining gap having a size not exceeding a prespecified threshold value, and the obstacle is detected within the remaining gap, taking an additional emergency measure selected from the group consisting of:
- deactivating a closing aid that is provided in addition to the adjustment motor and that, when activated, pulls the vehicle door into a locking position;
- preventing a latching of the vehicle door into a door locked position by automatically closing a door lock associated with the vehicle door and blocking the lock; and
- preventing the latching of the vehicle door into the door locked position by holding the door lock open to prevent the door lock from latching into a latched position.

2. An anti-trapping apparatus for a vehicle having a vehicle door that is adjustable between an open position and a closed position along an adjustment path by way of an adjustment motor, the apparatus comprising:
- a proximity sensor disposed to monitor an adjustment path region between the vehicle and the vehicle door for a presence of an obstacle; and
- a control and evaluation unit driving the adjustment motor, said control and evaluation unit being configured to carry out the following process steps during a closing movement of the vehicle door from the open position towards the closed position:
- monitoring the adjustment path region ahead of the vehicle door with said proximity sensor for the presence of the obstacle during the closing movement of the vehicle door;
- when an obstacle is found to be present in the adjustment path region, stopping or reversing the closing movement of the vehicle door; and
- when the obstacle is found to be present during the closing movement of the vehicle door, and the vehicle door is already closed as far as a remaining gap having a size not exceeding a prespecified threshold value, and the obstacle is detected within the remaining gap, taking an additional emergency measure; and
- wherein said control and evaluation unit is coupled to a closing aid for transmitting signals and said control and evaluation unit is configured to selectively deactivate the closing aid, the closing aid being provided in addition to the adjustment motor and being configured to pull the vehicle door into a locking position; and
- wherein said control and evaluation unit is coupled to a door lock for transmitting signals and said control and evaluation unit is configured to selectively close the door lock or keep the door lock open.

3. The anti-trapping apparatus according to claim 2, wherein said control and evaluation unit drives the adjustment motor indirectly or directly.

* * * * *